United States Patent [19]
Harada et al.

[11] Patent Number: 5,746,422
[45] Date of Patent: May 5, 1998

[54] CLAMPING DEVICE

[75] Inventors: Koichi Harada; Minoru Torihata; Takayuki Iiyama, all of Musashimurayama, Japan

[73] Assignee: Kabushiki Kaisha Shinkawa, Tokyo, Japan

[21] Appl. No.: 712,894

[22] Filed: Sep. 12, 1996

[30] Foreign Application Priority Data

Sep. 13, 1995 [JP] Japan ................................ 7-259510

[51] Int. Cl.⁶ ................................................ B25B 1/06
[52] U.S. Cl. ........................ 269/172; 269/221; 269/224; 269/237; 269/216; 269/329
[58] Field of Search .............................. 269/216, 329, 269/237, 224, 172, 91, 22, 221

[56] References Cited

U.S. PATENT DOCUMENTS 5,314,175  5/1994  Izumi et al. .......................... 269/224
5,462,600  10/1995 Pies ....................................... 269/91

FOREIGN PATENT DOCUMENTS

| 61-296781 | 12/1986 | Japan . |
| 1-245532 | 9/1989 | Japan . |
| 6-16519 | 3/1994 | Japan . |
| 6-260523 | 9/1994 | Japan . |
| 6-260524 | 9/1994 | Japan . |

Primary Examiner—Robert C. Watson
Attorney, Agent, or Firm—Koda and Androlia

[57] ABSTRACT

A clamping device used in, for instance, a bonding machine, using a piezo-electric element for opening and closing a pair of clamping claws for holding, for instance, bonding wires in between. The clamping device includes a pressure adjustment screw which applies a preparatory pressure to the piezo-electric element via a contact plate, and the contact plate is connected, via flexible sections which are capable of expansion and contraction, to a screw attachment with which the pressure adjustment screw is screw-engaged.

2 Claims, 3 Drawing Sheets

CLAMPING DEVICE

BACKGROUND OF THE INVENTION

1. Field of the Invention

The present invention relates to a clamping device which clamps a workpiece such as a wire, a plate-form member, etc. and more particularly to a clamping device which uses a piezo-electric element for clamping the workpiece.

2. Prior Art

Conventional devices which use a piezo-electric element for clamping wires in a wire bonding apparatus are disclosed in, for instance, Japanese Patent Application Laid-Open (Kokai) Nos. 1-245532, 6-260523 and 6-260524 and in Japanese Patent Application Publication (Kokoku) No. 6-16519. Furthermore, Japanese Patent Application Laid-Open (Kokai) No. 61-296781 discloses a device which uses a piezo-electric element for clamping plate-form members. In other words, the piezo-electric element is expanded and contracted so as to actuate a pair of clamping claws that hold workpieces in between.

In these clamping devices, the expansion and contraction of the piezo-electric element are enhanced by an amplifying means so that the clamping claws connected to the piezo-electric element are opened and closed to clamp or hold the workpiece such as wires and plate-form members.

FIG. 5 shows one example of a conventional clamping device.

In this device, when a voltage is applied to a piezo-electric element 30, the piezo-electric element 30 expands toward clamping claws 32A and 32B which are attached to clamping arms 31A and 31B, and an operating section 33 is caused to move in the same direction. As a result, leverage sections 34A and 34B pivot outward about fulcrum sections 35A and 35B as shown by arrow 0, and the clamping claws 32A and 32B are opened (i.e., separated from each other).

However, in this type of clamping device, it is necessary to apply a preparatory pressure to the piezo-electric element 30, and a pressure adjustment screw 38 is employed for such a preparatory pressure. In other words, a contact plate 36 to which one end of the piezo-electric element 30 is attached is formed with a slit groove 37 so that the contact plate 36 is bendable, and this contact plate 36 is pressed by the pressure adjustment screw 38.

Generally, piezo-electric elements are made from a vitreous material and are, therefore, extremely brittle. However, in the prior art described above, only a slit groove 37 is formed so as to allow the bending of the of the contact plate 36. Accordingly, the contact plate 36 tends to bend unevenly as shown in FIG. 6 when the contact plate 36 is pressed by the pressure adjustment screw 38, causing an offset contact with the end surface of the piezo-electric element 30 and a concentration of stress. As a result, there is a danger that the brittle piezo-electric element 30 can be destroyed.

SUMMARY OF THE INVENTION

Accordingly, the object of the present invention is to provide a clamping device that can greatly reduce the bending or deformation of the contact plate so that destruction of the piezo-electric element is prevented.

The object is accomplished by a unique structure of the present invention for a clamping device that includes a pair of clamping arms having clamping claws, a piezo-electric element which opens and closes the clamping claws so as to hold a workpiece in between, an amplifying means which amplifies the expansion and contraction of the piezo-electric element, and a pressure adjustment screw which applies a preparatory pressure to the piezo-electric element via a contact plate, and the unique structure of the present invention is that the contact plate is connected to a screw mount element, with which the pressure adjustment screw is screw-engaged, so that flexible sections which are capable of expansion and contraction are located between the contact plate and the screw mount element.

DETAILED DESCRIPTION OF THE PREFERRED EMBODIMENTS

Figure 1:
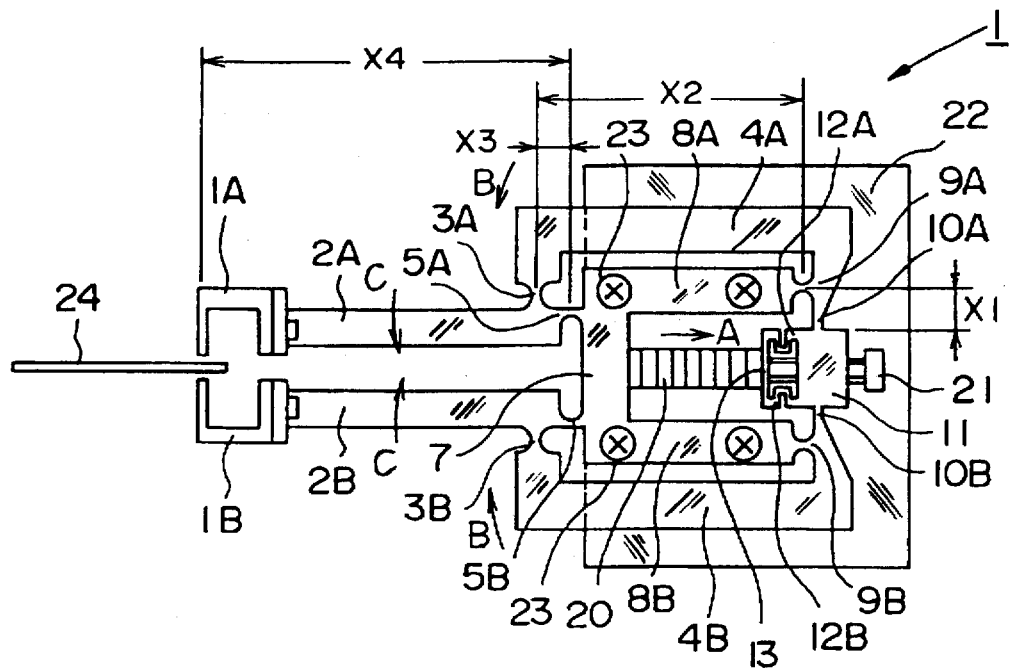
FIG. 1 is a front view of one embodiment of the clamping device according to the present invention.

A preferred embodiment of the present invention will be described with reference to FIGS. 1 and 2.

In essence, in the clamping device of the present invention, the respective end portions of a piezo-electric element 20 are fastened to a fastening section 7 and a contact plate 13 of the clamping device 1, and the contact plate 13 is connected, via flexible sections 12A and 12B (which are capable of expansion and contraction), to a screw mount element 11 with which a pressure adjustment screw 21 is screw-engaged. Thus, a preparatory pressure can be applied to the piezo-electric element 20 by the pressure adjustment screw 21 with the contact plate 13 in between.

More specifically, a pair of clamping arms 2A and 2B are connected to operating sections 4A and 4B with front leverage sections 3A and 3B in between, and the clamping arms 2A and 2B are further connected to a piezo-element fastening section 7 with front fulcrum sections 5A and 5B in between. Clamping claws 1A and 1B are coupled to the ends of the pair of clamping arms 2A and 2B, respectively.

Base fastening sections 8A and 8B which extend in the same direction as the operating sections 4A and 4B are formed on both sides of the piezo-element fastening section 7. The operating sections 4A and 4B are connected to the base fastening sections 8A and 8B with rear fulcrum sections 9A and 9B in between; and the operating section 4A and 4B are further connected to the screw mount element 11 with rear leverage sections 10A and 10B in between.

The screw mount element 11 is connected to the contact plate 13 with flexible sections 12A and 12B in between. The flexible sections 12A and 12B, as best seen in FIG. 2, consists of a bellows structure and are, therefore, capable of expansion and contraction.

The respective ends of the piezo-electric element 20 are fastened to the fastening section 7 and the contact plate 13, and a pressure adjustment screw 21 which presses the contact plate 13 is screw-engaged with the screw mount element 11. The base fastening sections 8A and 8B are securely provided by fastening screws 23 to a base plate 22 which is fastened to the clamping device.

In FIG. 1, the reference numeral 24 is a plate-form member such as a lead frame to be held between the clamping claws 1A and 1B of the clamping arms 2A and 2B.

Generally, a clamping device which uses a piezo-electric element requires that a preparatory pressure be applied to the piezo-electric element by pushing a plate element (the contact plate 13 in the above embodiment) with a pressure adjustment screw (the screw 21) so that the plate element tightly contacts the piezo-electric element. However, since the piezo-electric element is made from a vitreous material and is extremely brittle, if only one side of the piezo-electric element is pressed by the plate element, a concentrated stress is, as a result, applied to the piezo-electric element and damages the piezo-electric element, as described in the Prior Art.

Figure 2:
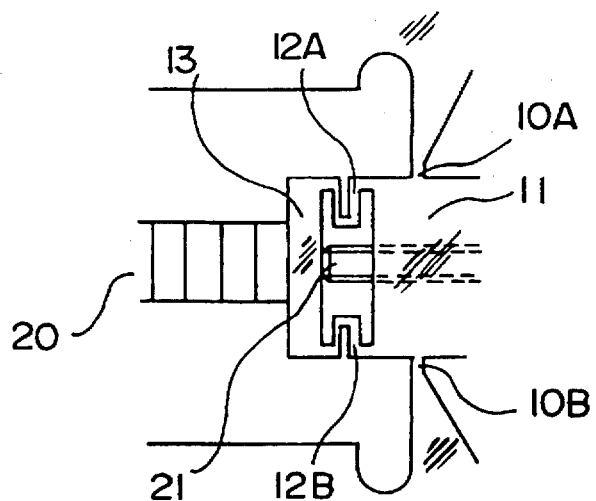
FIG. 2 is an enlarged front view of the essential portions of the clamping device.

In the preferred embodiment of the invention, the contact plate 13 is, in view of such problems, formed thick, and the thus made contact plate 13 is connected to the screw mount element 11 via the flexible sections 12A and 12B which, as seen from FIG. 2, consist of a bellows structure that are capable of expansion and contraction.

The piezo-electric element 20 is installed in the clamping device in the following manner:

The pressure adjustment screw 21 is loosened; and after both end surfaces of the piezo-electric element 20 are thinly coated with an adhesive agent, the piezo-electric element 20 is inserted into the space between the element fastening section 7 and the contact plate 13.

Then, the pressure adjustment screw 21 is tightened so that the contact plate 13 is pressed and a preparatory pressure is applied to the piezo-electric element 20 by the screw 21, thus causing the piezo-electric element 20 to be tightly adhered to the fastening section 7 and contact plate 13. In this case, the flexible sections 12A and 12B deform (or are contracted) so that deformation of the contact plate 13 is as small as possible. Accordingly, no offset contact of the contact plate 13 with the piezo-electric element 20 occurs, and destruction of the piezo-electric element 20 is prevented.

The operation of the clamping device of the above preferred embodiment will be described below.

The respective distances from the rear fulcrum sections 9A and 9B to the rear leverage sections 10A and 10B, and from the rear fulcrum sections 9A and 9B to the front leverage sections 3A and 3B, are designated as X1 and X2. Also, the respective distances from the front fulcrum sections 5A and 5B to the front leverage sections 3A and 3B, and from the front fulcrum sections 5A and 5B to the clamping claws 1A and 1B, are designated as X3 and X4. When no voltage is applied to the piezo-electric element 20, the clamping claws 1A and 1B are in a fully open state.

When a voltage is applied to the piezo-electric element 20, the piezo-electric element 20 expands by a distance $\Delta S$ toward the contact plate 13 (i. e., in the direction indicated by arrow A). This displacement $\Delta S$ causes the rear leverage sections 10A and 10B to be displaced in the direction indicated by arrow A via the contact plate 13, pressure adjustment screw 21 and screw mount element 11; and the displacement of the rear leverage sections 10A and 10B causes the operating sections 4A and 4B to pivot about the rear fulcrum sections 9A and 9B in the respective directions indicated by the arrows B. As a result, the front leverage sections 3A and 3B are displaced by an amplification of X2/X1 times.

This displacement of the front leverage sections 3A and 3B causes the clamping arms 2A and 2B to pivot about the front fulcrum sections 5A and 5B in the respective directions indicated by the arrows C. As a result, the clamping claws 1A and 1B are displaced by an amplification of X4/X3 times so as to hold the plate-form member 24. In this case, the amount of movement of each of the clamping claws 1A and 1B is amplified to an amount equal to:

$$\Delta S \times (X2/X1) \times (X4/X3)$$

The amount of movement of each of the clamping claws 1A and 1B will be described below using concrete numerical values.

The piezo-electric element which is commercially marketed and used in the preferred embodiment has:

1. a size of 5 mm (square)×18 mm (length),
2. a displacement of 15 microns (μm) per 100 V, and
3. a generating force of 87 kgf/100 V The respective distances referred to above are set as follows:

X1=5 mm,
X2=32 mm,
X3=5 mm, and
X4=45 mm.

When the piezo-electric element as specified above is used, if a voltage of 100 V is applied to this piezo-electric element, the piezo-electric element is displaced by a distance of $\Delta S$=15 microns (μm) in the direction indicated by arrow A. In other words, each of the clamping claws 1A and 1B are moved by an amount equal to 15×(32/5)×(45/5)=864 microns (μm). Accordingly, the maximum opening of the clamping claws 1A and 1B is 2×864=1728 microns (μm).

As to the clamping force of the clamping claws, it is generally true that the clamping force and the amount of amplification of the displacement are in an inversely proportional relationship. Accordingly, the holding or clamping force of the clamping claws 1A and 1B brought by the piezo-electric member having the above-listed specifications is 87 kgf/2×(32/5)×(45/5)=755 gf. The holding force of the dampers currently used in industry for plate-form members and wires is 200 to 400 gf; accordingly, it is clear that the clamping device of the present invention can provide a sufficient and usable clamping force, which is 755 gf as described above.

The holding or clamping force of the clamping claws 1A and 1B will be described even more concretely below with reference to FIGS. 3 and 4.

Figure 3:
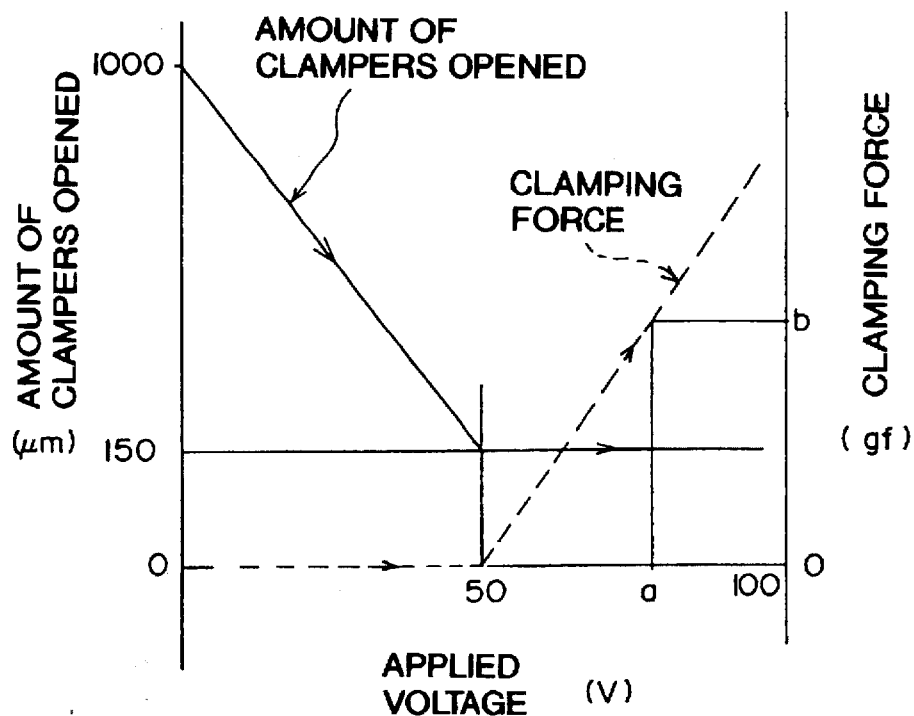
FIG. 3 shows the relationship among the applied voltage, the amount of opening of the clamping claws and the clamping. force of the clamping claws of the clamping device.
Figure 4:
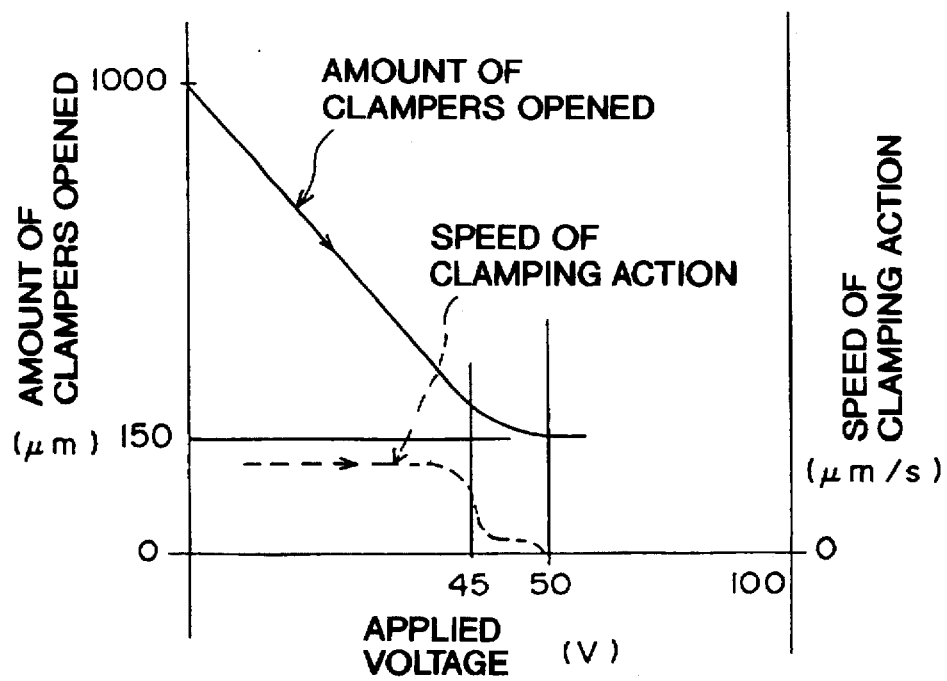
FIG. 4 shows the relationship among the applied voltage, the amount of opening of the clamping claws and the clamping claw operating speed of the clamping device.
Figure 5:
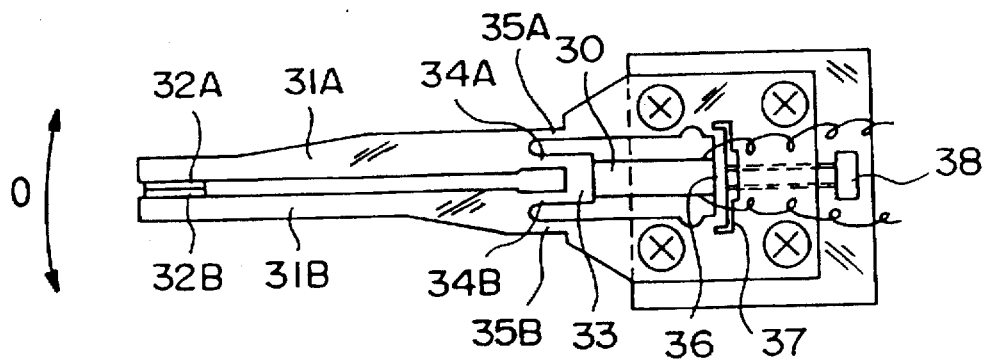
FIG. 5 is a front view of a conventional clamping device.
Figure 6:
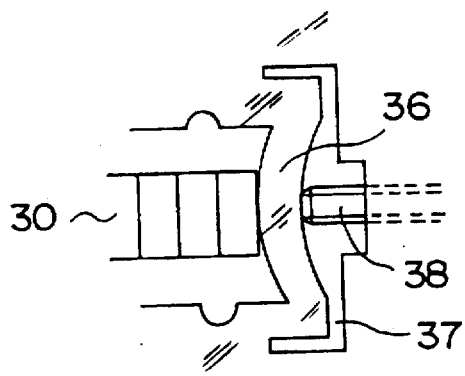
FIG. 6 is an enlarged view showing the problem occurring in the device shown in FIG. 5.

FIG. 3 illustrates a case in which the initial opening amount of the clamping claws 1A and 1B is 1,000 microns, and a plate-form member to be held has a thickness of 150 microns.

As the voltage applied to the piezo-electric element 20 is increased, the clamping claws 1A and 1B are moved in the closing direction; and when the applied voltage reaches approximately 50 V, the opening distance between the clamping claws 1A and 1B reaches 150 microns (from the initial distance of 1000 microns); as a result, the clamping claws 1A and 1B hold the plate-form member 24.

As the applied voltage is increased even further, the clamping force of the clamping claws 1A and 1B is increased as indicated by the dotted line in FIG. 3.

The increase of the clamping force is affected considerably by the strength of the fulcrum sections 9A and 9B and flulcrum sections 5A and 5B.

When the applied voltage is increased to the level a, then the clamping force of the clamping claws 1A and 1B reaches the level b which is a previously set level.

In clamping devices, it is generally desirable that clamping claws be opened and closed in such a manner that plate-form members are subjected to as little vibration as possible. However, if the clamping device is operated so that the claws are opened and closed slowly, productivity becomes low.

In view of the above, in the clamping device of this preferred embodiment, the operating speed is slowed down only during the period immediately before the closing of the clamping claws 1A and 1B. This is illustrated in FIG. 4. In particular, in the above described clamping device, since the clamping claws 1A and 1B begin to clamp the workpiece (i.e., the plate-form member 24) when the voltage applied to the piezo-electric element 20 reaches approximately 50 V, the rate at which the applied voltage is increased is rapid up to a value of 45 V (immediately prior to clamping) and is then slowed down beginning at 45 V. With this setting, waste time is minimized, and the workpieces are clamped softly.

In the above embodiment, the clamping device that holds the plate-form member 24 is described. However, the present invention is applicable to a clamping device for clamping bonding wires. In a such case, the clamping claws 1A and 1B has a shape which is suitable for clamping wires.

In addition, the clamping device of the preferred embodiment uses the displacement amplifying means which substantially comprises leverage sections, fulcrum sections and operation sections and amplifies the expansion and contraction of the piezo-electric element 20; however, the present invention is applicable to clamping devices that use different types of amplifying means or those that do not use such amplifying means.

As seen from the above, according to the present invention, a clamping device includes a pair of clamping arms to which clamping claws are respectively attached, a piezo-electric element which opens and closes the clamping claws so that the clamping claws hold a workpiece, an amplifying means which amplifies the expansion and contraction amount of the piezo-electric element, and a pressure adjustment screw which applies a preparatory pressure to the piezo-electric element via a contact plate; and the contact plate is connected, via flexible sections (which are capable of expansion and contraction), to a screw mount element with which the pressure adjustment screw is screw-engaged. Accordingly, deformation of the contact plate is minimized, and destruction of the piezo-electric element is prevented.

We claim:

1. A clamping device provided with a pair of clamping arms to which clamping claws are respectively attached, a piezo-electric element which opens and closes said clamping claws so as to hold a workpiece, an amplifying means which amplifies expansion and contraction of said piezo-electric element, and a pressure adjustment screw which applies a preparatory pressure to said piezo-electric element via a contact plate, wherein said contact plate is connected, via flexible sections which are capable of expansion and contraction, to a screw mount means with which said pressure adjustment screw is screw-engaged.

2. A clamping device according to claim 1, wherein said flexible sections has a bellows structure.

* * * * *